US012631959B2

(12) United States Patent
Zalkovskij

(10) Patent No.: US 12,631,959 B2
(45) Date of Patent: May 19, 2026

(54) OPTICAL ELEMENTS INCLUDING PSUEDORANDOM-SHAPED META-ATOMS

(71) Applicant: NIL Technology ApS, Kongens Lyngby (DK)

(72) Inventor: Maksim Zalkovskij, Copenhagen (DK)

(73) Assignee: NIL Technology ApS (DK)

( * ) Notice: Subject to any disclaimer, the term of this patent is extended or adjusted under 35 U.S.C. 154(b) by 463 days.

(21) Appl. No.: 18/120,606

(22) Filed: Mar. 13, 2023

(65) Prior Publication Data

US 2023/0314932 A1      Oct. 5, 2023

Related U.S. Application Data

(60) Provisional application No. 63/327,440, filed on Apr. 5, 2022.

(51) Int. Cl.
*G03F 7/00*          (2006.01)
*G02B 1/00*          (2006.01)

(52) U.S. Cl.
CPC .......... *G03F 7/0005* (2013.01); *G03F 7/0002* (2013.01); *G02B 1/002* (2013.01)

(58) Field of Classification Search
CPC ...... G03F 7/0005; G03F 7/0002; G02B 1/002
USPC ........................................................ 430/321
See application file for complete search history.

(56) References Cited

U.S. PATENT DOCUMENTS

2013/0162375 A1      6/2013  Kitaoka et al.
2020/0257194 A1      8/2020  Sorin et al.

2021/0044748 A1      2/2021  Hu et al.
2021/0307608 A1      10/2021  Hu et al.
2022/0326611 A1*    10/2022  Jiang ..................... G03F 7/0002
2023/0350112 A1*    11/2023  Bilenberg ............ G02B 5/1809
2024/0361496 A1*    10/2024  Zalkovskij ........... G03F 7/0005
2024/0369738 A1*    11/2024  Wang .................... G03F 9/7065

FOREIGN PATENT DOCUMENTS

WO      WO 2015038203      3/2015
WO      WO 2016065308      4/2016
WO      WO 2017044637      3/2017
WO      WO 2020095258      5/2020

(Continued)

OTHER PUBLICATIONS

A. Ahamed et al., "Reconstruction-based spectroscopy using CMOS image sensors with random photon-trapping nanostructure per sensor," Proceedings High-Speed Biomedical Imaging and Spectroscopy VII, SPIE, BIOS, vol. 11971 (2022).

*Primary Examiner* — Caleen O Sullivan
(74) *Attorney, Agent, or Firm* — Fish & Richardson P.C.

(57)      ABSTRACT

The disclosure describes optical elements including pseudorandom-shaped meta-atoms as well as related methods of manufacture. In some implementations, a method includes patterning a resist layer to form a pattern of features in the resist layer. The resist layer is disposed on a substrate that includes an optical sublayer disposed on a support. The substrate further includes a hard mask sublayer disposed on the optical sublayer. The method includes performing a first oxygen plasma etch to impart a pseudorandom shape to the features in the resist layer, and subsequently performing a plurality of etching operations to cause the pseudorandom-shaped features to be transferred into the optical sublayer of the substrate.

14 Claims, 6 Drawing Sheets

(56)        References Cited

FOREIGN PATENT DOCUMENTS

| WO | WO 2021025759 | 2/2021 |
| WO | WO 2021231889 | 11/2021 |
| WO | WO 2022183094 | 9/2022 |

* cited by examiner

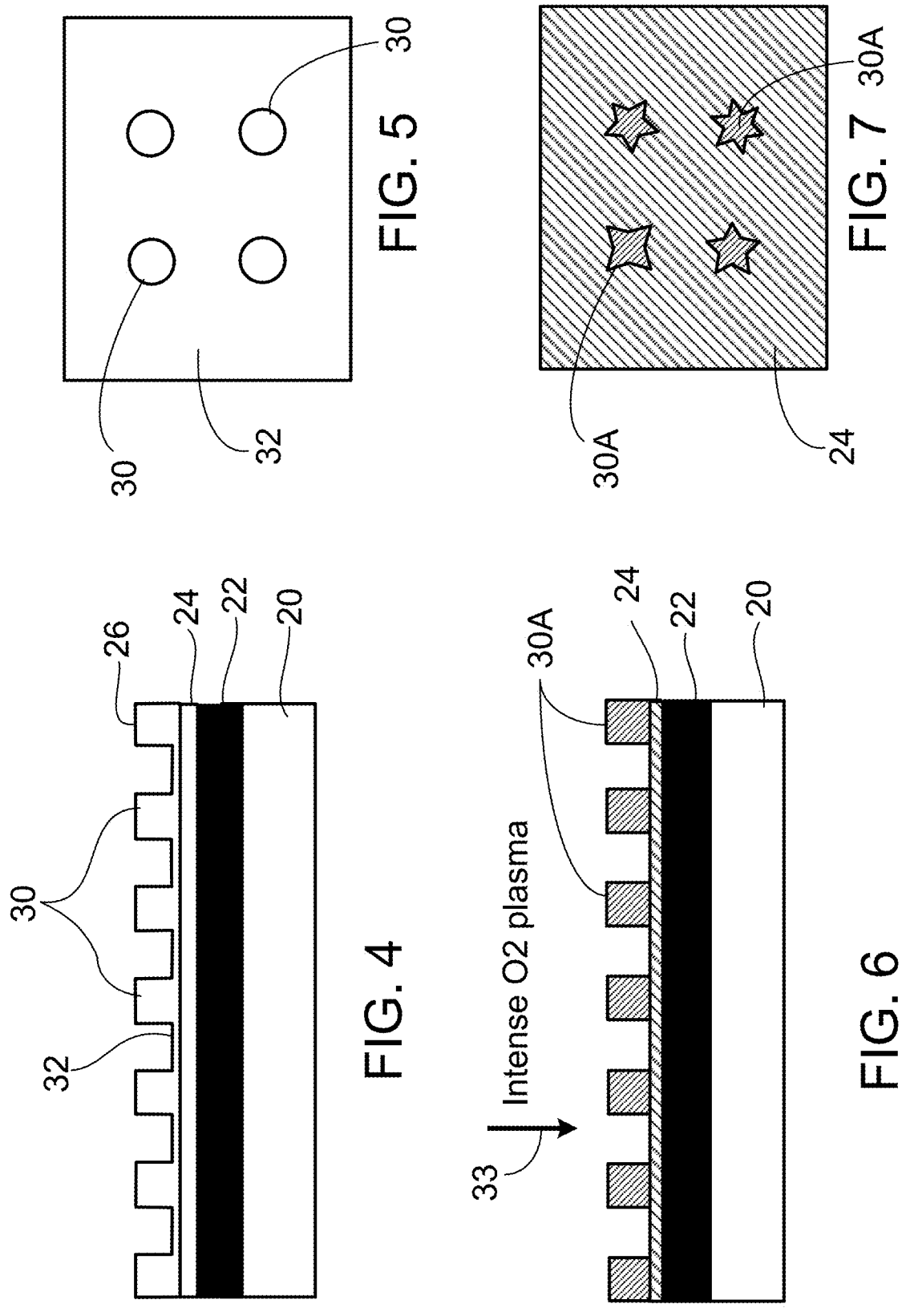

38 etch metal mask

22A

22

20

22A

20

22A

OPTICAL ELEMENTS INCLUDING PSUEDORANDOM-SHAPED META-ATOMS

CLAIM OF PRIORITY

This application claims priority to U.S. Provisional Application Ser. No. 63/327,440, filed on Apr. 5, 2022, the entire contents of which are incorporated herein by reference.

FIELD OF THE DISCLOSURE

The present disclosure relates to optical structures.

BACKGROUND

Meta optical elements (MOEs) include a metasurface having a distributed array of meta-atoms (e.g., nanostructures) that are arranged, individually or collectively, to interact with light waves. For example, the nanostructures or other meta-atoms may change a local amplitude, a local phase, or both, of an incoming light wave.

SUMMARY

The present disclosure describes optical elements that includes pseudorandom-shaped features, as well as related methods of manufacture.

For example, in one aspect, the present disclosure describes a method that includes patterning a resist layer to form a pattern of features in the resist layer. The resist layer is disposed on a substrate that includes an optical sublayer disposed on a support. The substrate further includes a hard mask sublayer disposed on the optical sublayer. The method includes performing a first oxygen plasma etch to impart a pseudorandom shape to the features in the resist layer, and subsequently performing a plurality of etching operations to cause the pseudorandom-shaped features to be transferred into the optical sublayer of the substrate.

Some implementations include one or more of the following features. For example, in some implementations, the pseudorandom-shaped features transferred into the optical sublayer of the substrate are meta-atoms of an optical element. In some cases, the pseudorandom-shaped features transferred into the optical sublayer of the substrate have a cross-section that is not circular and that does not have a regular polygonal shape. In some instances, an outer boundary of each meta-atom has a pseudorandom shape.

In some implementations, patterning the resist layer includes imprinting a structured surface of a tool into the resist layer to form the features in the resist layer. In some cases, the method includes imparting a pseudorandom shape to the imprinted features while substantially maintaining at least one of a period or lattice of the imprinted features as defined by the structured surface of the tool, wherein the structured surface has features corresponding to a pixel layout design for the meta-atoms. In some cases, the method includes imparting a pseudorandom shape to the imprinted features while substantially maintaining an area of the imprinted features as defined by the structured surface of the tool.

In some implementations, the optical sublayer is composed of at least one of amorphous silicon, crystalline silicon, silicon nitride, zinc oxide, titanium oxide, aluminum zinc oxide, or a niobium oxide. In some implementations, the hard mask sublayer is composed of a metal (e.g., chrome). In some cases, the support is composed of glass, the optical sublayer is composed of polysilicon, and the hard mask sublayer is composed of a metal.

In some implementations, performing the etching operations includes performing the following etches sequentially: performing a second etch to remove exposed portions of the hard mask sublayer; performing a third etch to remove exposed portions of the optical sublayer; and performing a fourth etch to remove remaining portions of the resist layer and the metal mask sublayer.

In some implementations, performing the first oxygen plasma etch includes performing the first oxygen plasma etch using a sufficiently high coil power so as to impart the pseudorandom shape to the features in the resist layer. In some cases, performing the first oxygen plasma etch also removes a residual layer of the resist.

The present disclosure also describes an apparatus including a meta-optical element that includes a plurality of meta-atoms each of which has a respective pseudorandom-shape.

Some implementations include one or more of the following features. For example, in some implementations, each of the meta-atoms has a cross-section that is not circular and that does not have a regular polygonal shape. In some cases, an outer boundary of each meta-atom has a pseudorandom shape.

In some implementations, the meta-atoms are composed of silicon. The meta-atoms may be, for example, on a glass support.

Other aspects, features and advantages will be readily apparent from the following detailed description, the accompanying drawings and the claims.

BRIEF DESCRIPTION OF THE DRAWINGS

FIG. 4 illustrates the resist layer after the imprinting of FIG. 3.

FIG. 5 illustrates a top view showing examples of the imprinted features.

FIG. 6 illustrates an example of an oxygen plasma etch.

FIG. 7 illustrates a top view showing examples of the pseudorandom shape of the imprinted features after the oxygen plasma etch.

DETAILED DESCRIPTION

Figure 1:
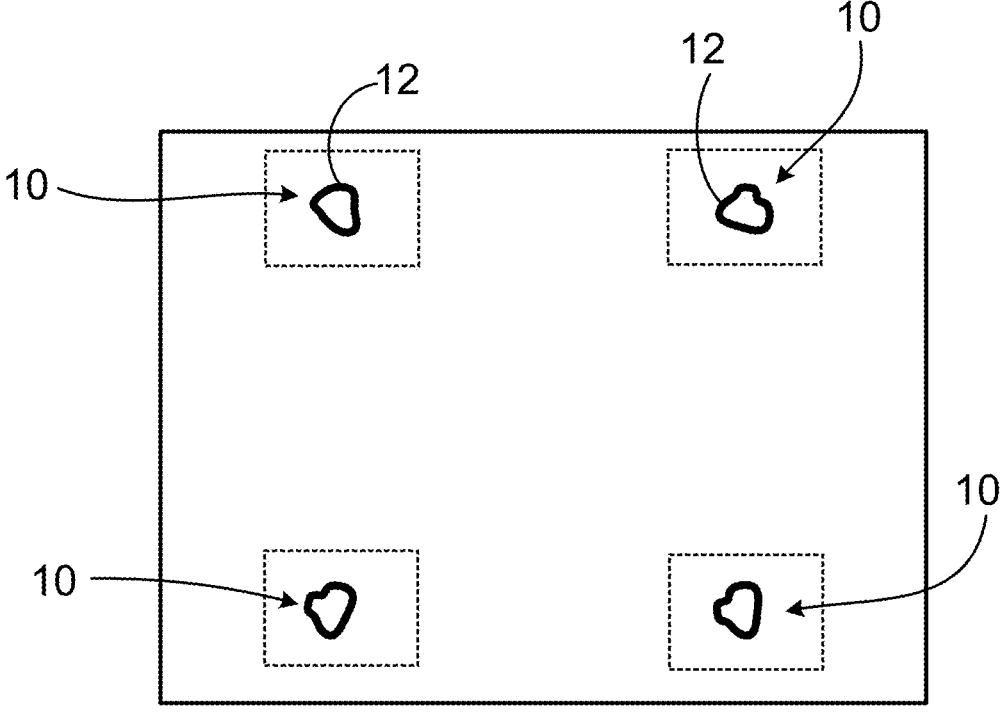
FIG. 1 illustrates example of meta-atoms having a pseudorandom shape.

The present disclosure describes methods for producing meta-atoms having a pseudo-random shape. Thus, the methods can be used to produce optical elements (e.g., MOEs) that include meta-atoms having a cross-section that is not circular and that does not have the shape of a regular polygon. The techniques can, in some instances, provide a controlled way of producing pseudorandom shaped meta-atoms. In particular, in accordance with some implementations, as illustrated in FIG. 1, the shape of the outer boundary 12 of each meta-atom 10 can be pseudorandom, while the overall volume of the pattern of meta-atoms can be controlled to a large degree. Thus, in some instances, the techniques described in this disclosure can facilitate providing pseudorandom shaping of meta-atoms while substantially maintaining the location (i.e., period/lattice) and area of the meta-atoms as defined, for example, by an imprint tool that has a structured surface corresponding to the pixel layout design for the meta-atoms.

In accordance with the present disclosure, pseudorandom shaping of the meta-atoms can be achieved, for example, by applying an intense (i.e., a relatively high coil power) $O_2$ plasma to the material that has been imprinted with the structured surface of the tool. Subsequently, etching operations can be performed to cause the imprinted structure to be transferred to an optical sublayer of a substrate.

Figures 2, 3:
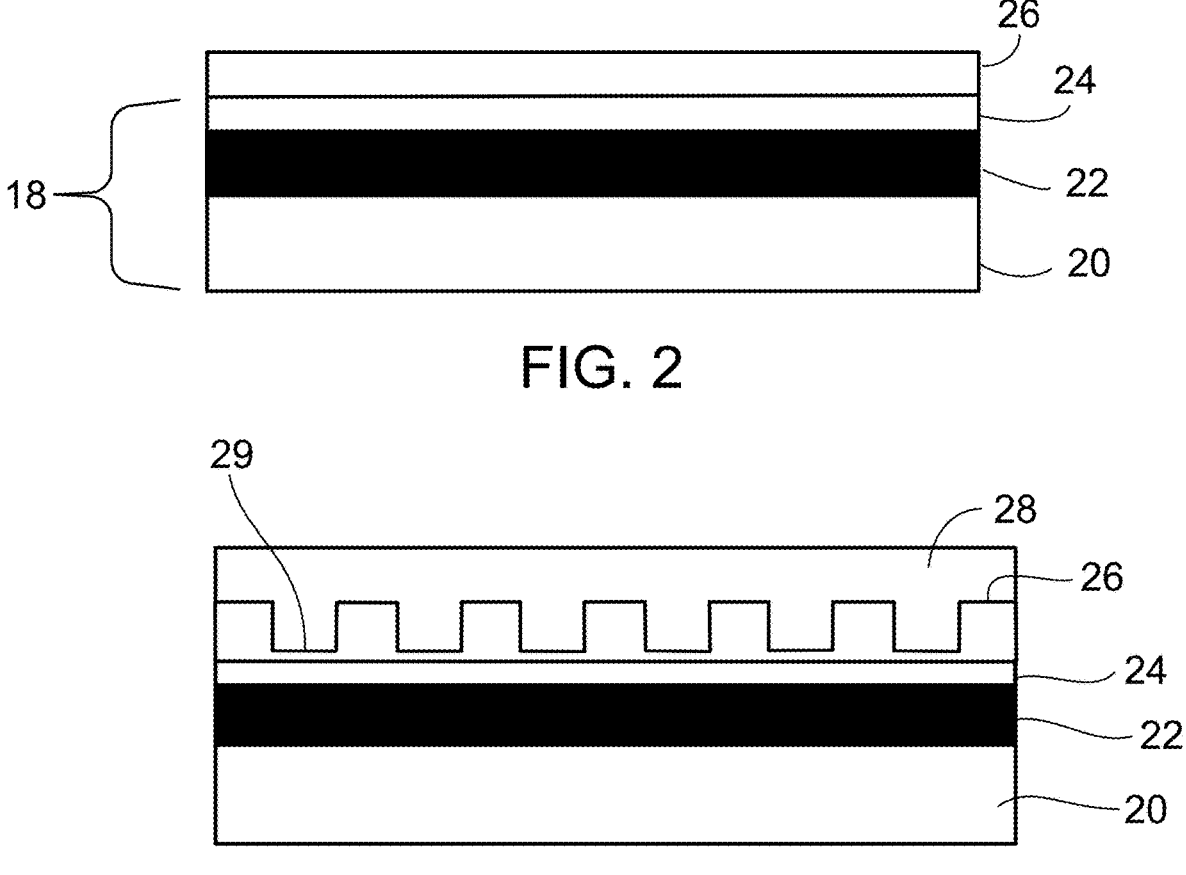
FIG. 2 illustrates an example of a resist layer on a substrate that includes an optical sublayer.
FIG. 3 illustrates an example of imprinting the resist layer.

FIGS. 2 through 11 illustrate fabrication steps in an example process for manufacturing a metastructure that includes pseudorandom shaped meta-atoms. As illustrated by FIG. 2, a substrate 18 is provided. The substrate 18 includes several sublayers, including an optical sublayer 22 on a glass or other support 20 that is substantially transparent to a particular wavelength or range of wavelengths (e.g., in the infra-red part of the electromagnetic spectrum). In the illustrated example, the optical sublayer 22 is composed of a material having a relatively high index of refraction such as amorphous polysilicon. In some implementations, the optical sublayer 22 can be composed, for example, of silicon nitride, zinc oxide, amorphous silicon, crystalline silicon, titanium oxide, aluminum zinc oxide, a niobium oxide (e.g., $NbO$, $NbO_2$ or $Nb_2O_5$), or some other transparent conductor material. In some instances, the optical sublayer 22 has a thickness in the range of 300-2000 nanometers (nm). The substrate 18 further includes a hard mask sublayer 24 on the optical sublayer 22. The hard mask sublayer 24 can be composed, for example, of a metal, such as chrome (Cr), aluminum (Al) or titanium (Ti). The hard mask sublayer 24 can be deposited, for example by e-beam evaporation. In some implementations, the hard mask sublayer 24 has a thickness in the range of 5-50 nm, although other thicknesses may be appropriate for other implementations.

As further shown in FIG. 2, an imprint layer 26 is disposed on the hard mask sublayer 24. The imprint layer 26 can be composed, for example, of a UV-curable resist. As shown in FIG. 3, a tool (e.g., a mold) 28 can be used to imprint a structure into the resist layer 26. The tool 28 includes a structured surface 29 that corresponds, for example, to the pixel layout design for the MOEs to be formed in the optical sublayer 22 of the substrate 18. The resist layer 26 can be imprinted by the structured surface 29 of the tool 28 using, for example, nanoimprint lithography (NIL). The features of the tool's structured surface may have a regular polygonal or circular cross-section. In general, the structured pattern imprinted into the resist layer 26 will be a negative of the pattern in the surface 29 of the tool 28. Thus, if the features of the tool's structured surface have a regular polygonal or circular cross-section, the features imprinted into the resist layer 26 also will have a regular polygonal or circular cross-section. FIGS. 4 and 5 illustrate an example of the structure (including pillars 30 that have a circular cross-section) imprinted into the resist layer 26 after the tool 28 is removed.

In some cases, instead of imprint techniques, standard lithography processes (e.g., ultra-violet (UV), deep UV (DUV), electron beam lithography (EBL), maskless aligners) can be used to form the pattern of features in the resist layer, where the features have regular polygonal or circular cross-sections.

As can be seen in FIGS. 4 and 5, the imprint operation may result in a thin residual layer 32 of the resist material on the surface of the hard mask sublayer 24. As indicated by FIG. 6, an intense (i.e., relatively high power) $O_2$ plasma etch 33 can be performed to remove the residual layer 32. The $O_2$ plasma can be chosen to have sufficiently high intensity that it also causes the imprinted features to become somewhat misshapen, thereby imparting a pseudorandom shape. That is, the intensity of the $O_2$ plasma can be chosen to cause a pseudorandom re-shaping of the lateral design of the features corresponding to the meta-atoms. For example, in some implementations, a coil power of about 800 watts (W) and a platen power of 100 W can be applied. The intensity, however, should not be so high as to distort the desired optical properties of the meta-atoms. In some implementations, reshaping of the resist pattern by plasma can be achieved by applying a broad span of different etching parameters (e.g., different pressures, powers. etc.). In FIGS. 6 and 7, the pseudorandom-shaped features are indicated by 30A.

Figures 8A, 8B, 9A, 9B:
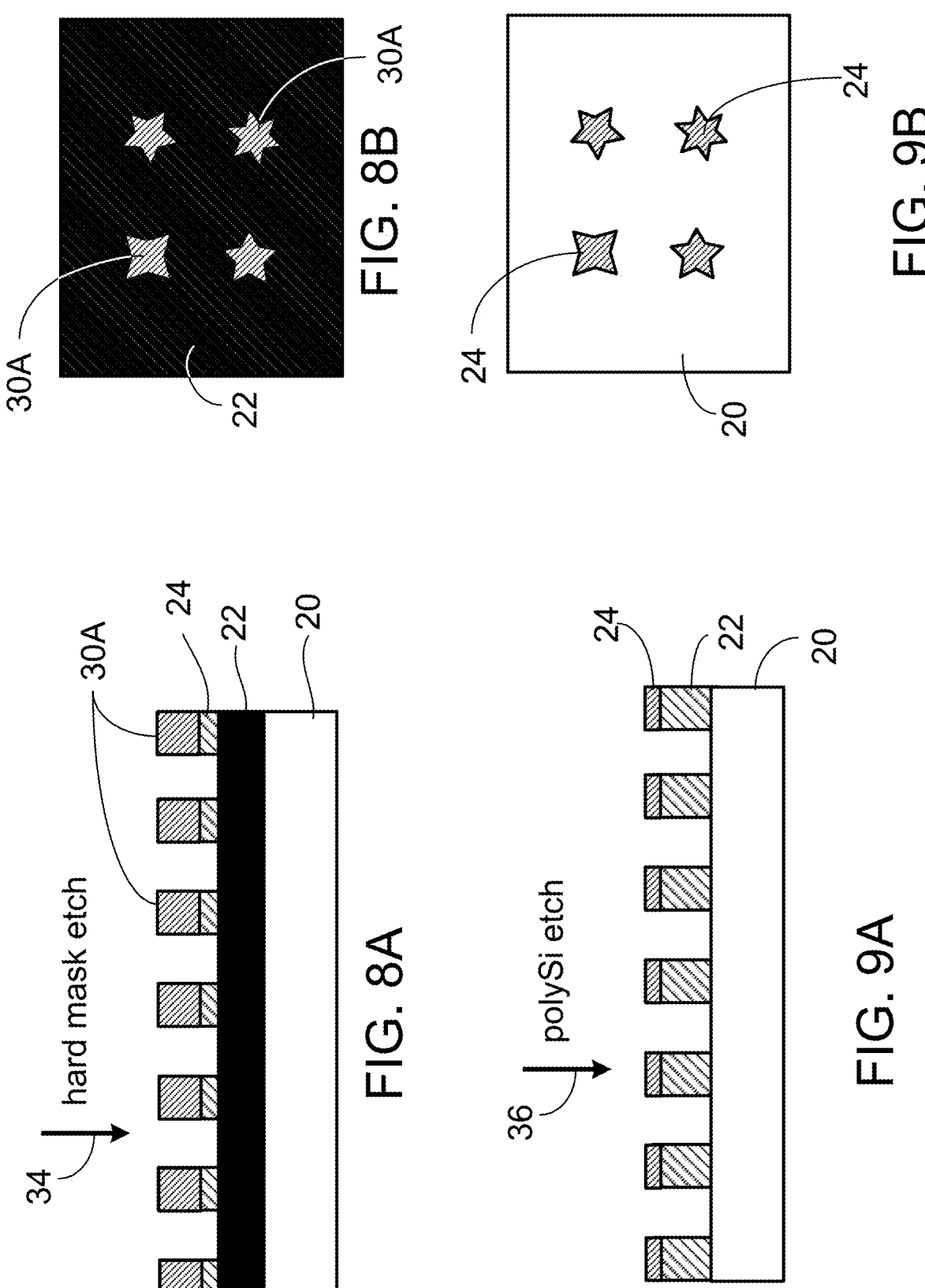
FIGS. 8A, 9A and 10 illustrate an example of a sequence of further etch operations.
FIG. 8B is a top view of FIG. 8A.
FIG. 9B is a top view of FIG. 9A.

Next, as illustrated by FIGS. 8A and 8B, a second etch 34 is performed to remove the exposed portions of the hard mask (e.g., metal) sublayer 24. That is, the portions of the hard mask sublayer 24 not directly under the pseudorandom-shaped features 30A of the hardened resist are etched away. During this etch, the pseudorandom-shaped features 30A of the hardened resist serve as a mask that substantially prevents etching of the portions of the hard mask sublayer 24 that are directly under the pseudorandom-shaped features 30A. In some instances, this etch can be achieved by using an inductively coupled plasma (ICP) etch.

Then, as illustrated by FIGS. 9A and 9B, a third etch 36 is performed to remove the exposed portions of the optical (e.g., amorphous polysilicon) sublayer 22 as well as the remaining portions of the resist layer 30A. That is, the portions of the optical sublayer 24 not directly under hard mask sublayer 24 are etched away. During this etch, the hard mask sublayer 24 serves as a mask that substantially prevents etching of the underlying portions of the optical sublayer 22. In some instances, this etch can be achieved by using an inductively coupled plasma (ICP) etch.

Figure 10:
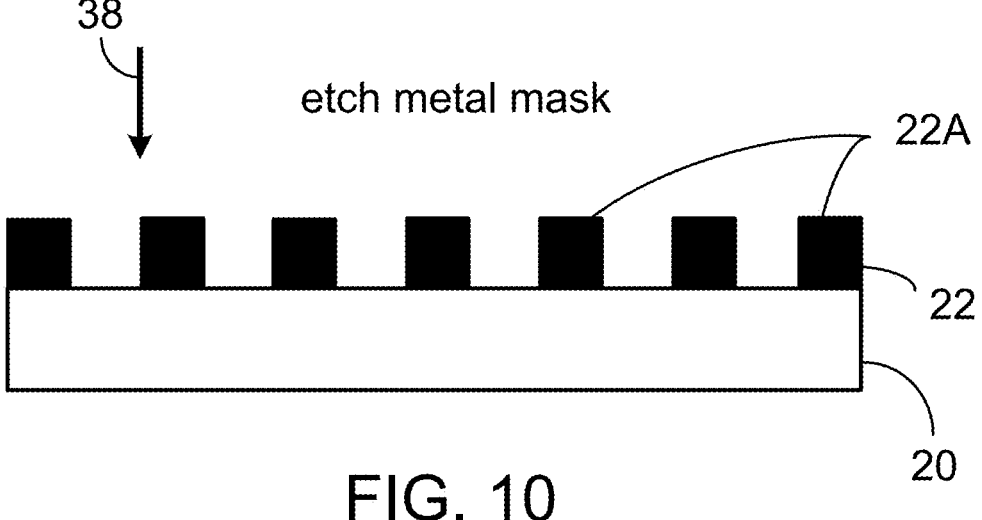
Figure 11:
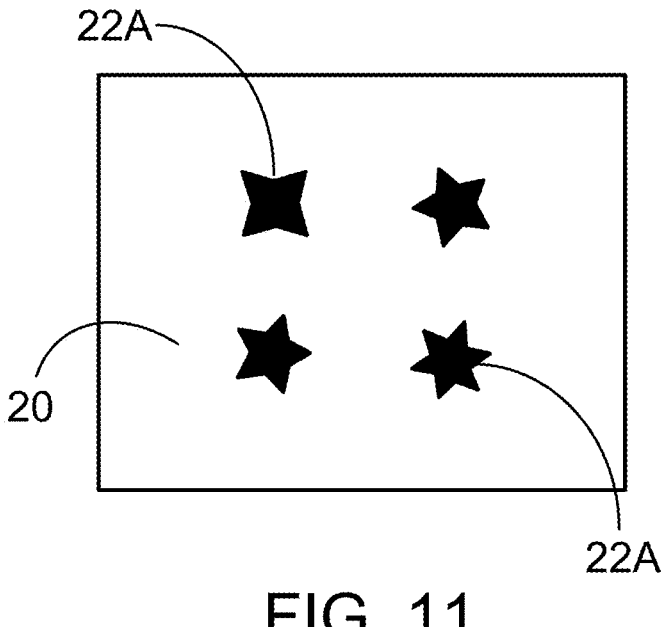
FIG. 11 illustrates a top view showing meta-atoms having a pseudorandom shape.

Next, a fourth etch 38 is performed to remove remaining portions 30A of the resist layer (if any) and the metal mask sublayer 24 (see FIG. 10). The result of this etch, according to an example implementation, is illustrated in FIGS. 10 and 11, which show that the remaining portions 30A of the resist layer (if any) and the hard mask sublayer 24 have been selectively etched away. In some instances, this etch can be achieved using an ICP etch. A comparison of FIG. 11 to FIG. 7 illustrates that the structure of pseudorandom-shaped features 30A previously formed in the resist layer 26 has been transferred, as a result of the sequence of etching operations, to the optical sublayer 22. That is, the optical sublayer 22 now includes a pattern of pseudorandom-shaped features 22A that is substantially the same as the pseudorandom-shaped features 30A previously formed in the resist layer 26.

The foregoing method describes a particular process flow for obtaining pseudorandom shaping of meta-atoms. Pseudorandom shaping of meta-atoms can be implemented using other process flows as well.

The foregoing techniques can be used, for example, as part of a mass production manufacturing process. Manufacturing the optical elements may take place in some instances at a wafer-level in which tens, hundreds, or even thousands of optical elements are formed in parallel using the same tool. In some instances, the glass or other support 20 can be separated, for example by dicing, into individual optical elements (e.g., MOEs) whose meta-atoms have a pseudo-random-shaped cross-section. The optical element may be configured according to a predefined optical function and many be operable for use, e.g., with infra-red (IR) or visible radiation.

In some implementations, an MOE including meta-atoms that have a pseudorandom-shaped cross-section can be integrated into modules that house one or more optoelectronic devices (e.g., light emitting and/or light sensing devices). The optical element can be used to modify or redirect an emitted or incoming light wave as it passes through the optical element.

Figure 12:
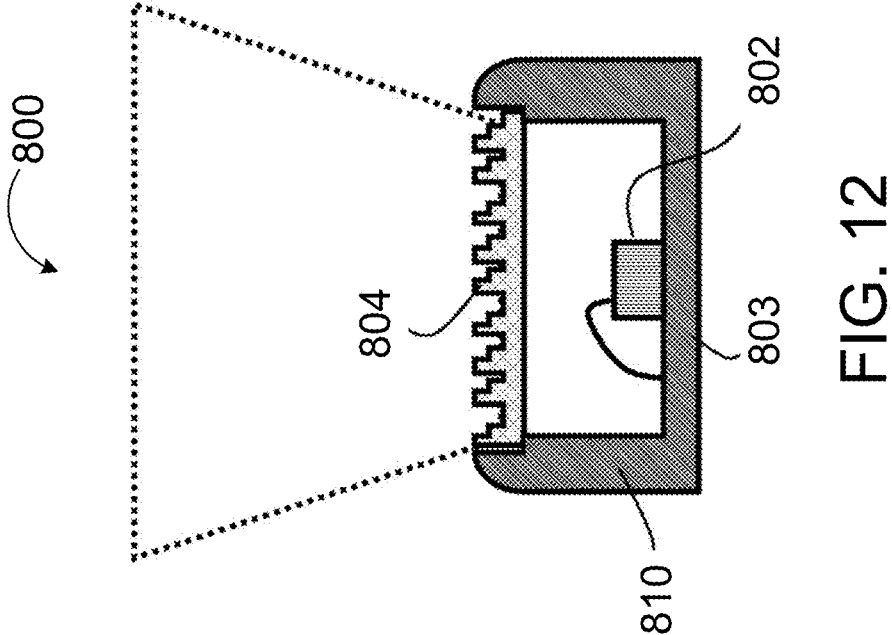
FIG. 12 illustrates an example of a single channel module incorporating a meta-optical element having pseudorandom-shaped meta-atoms.

Optical elements including meta-atoms that have a pseudorandom-shaped cross-section as described above can be integrated, for example, into a light sensing or light emitting module. For example, as shown in FIG. 12, a light sensing module (for example, an ambient light sensor module) 800 includes an active optoelectronic device 802 mounted on a substrate 803. The optoelectronic device 802 can be, for example, a light sensor (e.g., a photodiode, a pixel, or an image sensor) or a light emitter (e.g., a laser such as a vertical-cavity surface-emitting laser, or a light emitting diode). The module housing may include, for example, spacers 810 separating the optoelectronic device 802 and/or the substrate 803 from an optical element 804 including meta-atoms that have a pseudorandom-shaped cross-section as described above.

In the single-channel module of FIG. 12, the optical element 804 can be disposed so as to intersect a path of incoming light or to intersect a path of outgoing light. The optical element can be aligned with the active optoelectronic component 802 and can be mounted to the housing. In some cases (e.g., where the optoelectronic component is a light sensor), light incident on the module 800 is modified or redirected by the optical element 804. For example, in some cases, the optical element 804 modifies one or more characteristics of the light impinging on the optical element before the light is received and sensed by the optoelectronic component 802. In some instances, for example, the optical element 804 may focus patterned light onto the optoelectronic component 802. In some instances, the optical element 804 may split, diffuse and/or polarize the light before it is received and sensed by the optoelectronic component 802.

In some cases (e.g., where the optoelectronic component 802 is a light emitter), light generated by the optoelectronic component 802 passes through the optical element 804 and out of the module. In the single-channel module of FIG. 12, the optical element 804 can be disposed so as to intersect a path of the outgoing light 806. The optical element 804 can modify or redirect the light. For example, in some cases, one or more characteristics of the light impinging on the optical element are modified before the light exits the module 800. In some cases, the module 800 is operable to produce, for example, one or more of structured light, diffused light, or patterned light.

Figure 13:
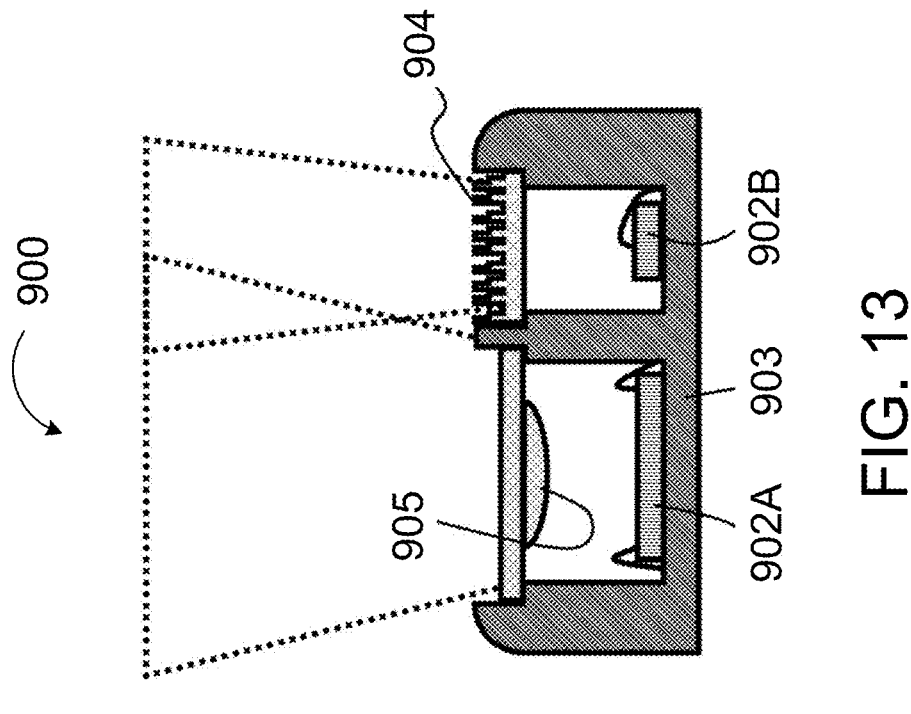
FIG. 13 illustrates an example of a multi-channel module incorporating a meta-optical element having pseudorandom-shaped meta-atoms.

One or more optical elements including meta-atoms that have a pseudorandom-shaped cross-section as described also can be integrated into multi-channel modules. As shown in FIG. 13, such a multi-channel module 900 can include, for example, a light sensor 902A and a light emitter 902B, both of which can be mounted on the same printed circuit board (PCB) or other substrate 903. In the illustrated example, an optical element 904 including meta-atoms that have a pseudorandom-shaped cross-section as described above is mounted to the housing over the light emitter 902B. The multi-channel module can include a light emission channel and a light detection channel, which may be optically isolated from one another by a wall that forms part of the module housing. A lens 905 may be provided over the light sensor 902A.

In some instances, one or more of the modules described above may be integrated, for example, into mobile phones, laptops, televisions, wearable devices, or automotive vehicles.

While this document contains many specific implementation details, these should not be construed as limitations on the scope of any inventions or of what may be claimed, but rather as descriptions of features specific to particular embodiments. Certain features that are described in this document in the context of separate embodiments can also can be implemented in combination in a single embodiment. Conversely, various features that are described in the context of a single embodiment can also can be implemented in multiple embodiments separately or in any suitable subcombination. Various modifications can be made to the foregoing examples. Accordingly, other implementations also are within the scope of the claims.

What is claimed is:

1. A method comprising:
   patterning a resist layer to form a pattern of features in the resist layer, wherein the resist layer is disposed on a substrate that includes an optical sublayer disposed on a support, the substrate further including a hard mask sublayer disposed on the optical sublayer;
   performing a first oxygen plasma etch to impart a pseudorandom shape to the features in the resist layer; and
   subsequently performing a plurality of etching operations to cause the pseudorandom-shaped features to be transferred into the optical sublayer of the substrate.

2. The method of claim 1 wherein the pseudorandom-shaped features transferred into the optical sublayer of the substrate are meta-atoms of an optical element.

3. The method of claim 2 wherein the pseudorandom-shaped features transferred into the optical sublayer of the substrate have a cross-section that is not circular and that does not have a regular polygonal shape.

4. The method of claim 2 wherein an outer boundary of each meta-atom has a pseudorandom shape.

5. The method of claim 1 wherein patterning the resist layer includes imprinting a structured surface of a tool into the resist layer to form the features in the resist layer.

6. The method of claim 5 including imparting a pseudorandom shape to the imprinted features while substantially maintaining at least one of a period or lattice of the imprinted features as defined by the structured surface of the tool, wherein the structured surface has features corresponding to a pixel layout design for meta-atoms.

7. The method of claim 5 including imparting a pseudorandom shape to the imprinted features while substantially maintaining an area of the imprinted features as defined by the structured surface of the tool.

8. The method of claim 1 wherein the optical sublayer is composed of at least one of amorphous silicon, crystalline silicon, silicon nitride, zinc oxide, titanium oxide, aluminum zinc oxide, or a niobium oxide.

9. The method of claim 1 wherein the hard mask sublayer is composed of a metal.

10. The method of claim 9 wherein the metal is chrome.

11. The method of claim 1 wherein the support is composed of glass, the optical sublayer is composed of polysilicon, and the hard mask sublayer is composed of a metal.

12. The method of claim 9 wherein performing a plurality of etching operations includes performing the following etches sequentially:

performing a second etch to remove exposed portions of the hard mask sublayer;

performing a third etch to remove exposed portions of the optical sublayer; and performing a fourth etch to remove remaining portions of the resist layer and the metal mask sublayer.

13. The method of claim 1 wherein performing the first oxygen plasma etch includes performing the first oxygen plasma etch using a sufficiently high coil power so as to impart the pseudorandom shape to the features in the resist layer.

14. The method of claim 13 wherein performing the first oxygen plasma etch also removes a residual layer of the resist.

\* \* \* \* \*